(12) United States Patent
Hallin

(10) Patent No.: US 11,012,162 B2
(45) Date of Patent: May 18, 2021

(54) LOCAL OSCILLATOR LEAKAGE DETECTING AND CANCELLATION

(71) Applicant: Telefonaktiebolaget LM Ericsson (publ), Stockholm (SE)

(72) Inventor: Joakim Hallin, Askim (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/954,374

(22) PCT Filed: Dec. 18, 2017

(86) PCT No.: PCT/SE2017/051291
§ 371 (c)(1),
(2) Date: Jun. 16, 2020

(87) PCT Pub. No.: WO2019/125237
PCT Pub. Date: Jun. 27, 2019

(65) Prior Publication Data
US 2020/0382060 A1  Dec. 3, 2020

(51) Int. Cl.
*H04B 15/06*  (2006.01)
*H03D 7/16*  (2006.01)
(Continued)

(52) U.S. Cl.
CPC ............ *H04B 15/06* (2013.01); *H03D 7/161* (2013.01); *H03D 7/166* (2013.01); *H04B 1/02* (2013.01);
(Continued)

(58) Field of Classification Search
CPC ..................................... H04B 15/06
See application file for complete search history.

(56) References Cited

U.S. PATENT DOCUMENTS 7,970,358 B2 * 6/2011 Darabi .................. H03B 27/00
455/86
2004/0132424 A1 * 7/2004 Aytur .................... H04B 1/0475
455/335
(Continued)

FOREIGN PATENT DOCUMENTS

CN  102739584 B  4/2015
CN  103067321 B  7/2015
(Continued)

OTHER PUBLICATIONS

International Search Report and Written Opinion for International Patent Application No. PCT/SE2017/051291, dated Mar. 1, 2018, 9 pages.

*Primary Examiner* — Hsinchun Liao
(74) *Attorney, Agent, or Firm* — Withrow & Terranova, PLLC

(57) ABSTRACT

A mixer circuitry comprises a mixer, a local oscillator (LO) leakage detector, a digital LO leakage cancellation controller and a DAC arrangement. The mixer is configured to mix a first LO signal having an LO frequency $f_{LO}$ with an intermediate frequency (IF) signal and generate an output signal, i.e. a wanted signal. The LO leakage detector measures the LO leakage at the output of the mixer in the presence of the wanted signal. Then in the digital LO leakage cancellation controller, a digital algorithm is run that automatically adjusts the LO leakage in the mixer by steering the digital-to-analog converter arrangement such that the intermediate frequency input signal level to the mixer is adjusted.

12 Claims, 3 Drawing Sheets

(51) Int. Cl.
    *H04B 1/04*      (2006.01)
    *H04B 1/02*      (2006.01)
    *H04B 1/10*      (2006.01)
(52) U.S. Cl.
    CPC ......... *H04B 1/0475* (2013.01); *H04B 1/1027* (2013.01)

(56) References Cited

U.S. PATENT DOCUMENTS

| | | | |
|---|---|---|---|
| 2008/0211576 A1* | 9/2008 | Moffatt | H03F 3/24 330/149 |
| 2015/0118980 A1 | 4/2015 | Leung et al. | |
| 2018/0254786 A1* | 9/2018 | McLaurin | H04B 1/0475 |

FOREIGN PATENT DOCUMENTS

| | | |
|---|---|---|
| KR | 20030077705 A | 10/2003 |
| WO | 2016202368 A1 | 12/2016 |

\* cited by examiner

LOCAL OSCILLATOR LEAKAGE DETECTING AND CANCELLATION

This application is a 35 U.S.C. § 371 national phase filing of International Application No. PCT/SE2017/051291, filed Dec. 18, 2017, the disclosure of which is incorporated herein by reference in its entirety.

TECHNICAL FIELD

Embodiments herein relate to local oscillator leakage detecting and cancellation. In particular, the embodiments herein relate to a mixer circuitry with a local oscillator leakage detector, as well as electronic circuits comprising the mixer circuitry.

BACKGROUND

Wireless communication systems usually comprise complex chains of transmitter and receiver circuits, including several frequency conversion steps. The transmitter circuits typically up-convert baseband signals to Radio Frequency (RF) signals for transmission, and the receiver circuits down-convert received RF signals to baseband signals for processing. Such frequency conversion requires mixers to mix two frequency signals.

Any RF or microwave transmitter that includes a mixer to convert an incoming signal frequency to a final output signal frequency will have some spurious or unwanted signal in the output signal that is outside of the allocated spectrum for signal transmission. There are standards that dictate allowed spurious emission levels outside of a channel spectrum. In particular, a mixer that mixes the incoming signal frequency with a local oscillator (LO) frequency will also have some level of undesired output signal at the local oscillator frequency. This may be overcome by using a quadrature mixer that is intentionally biased with Direct Current (DC) signals to cancel or attenuate so called LO leakage. This is typically done in all microwave transmitter chains by a calibration procedure in a factory which gives some level of cancellation or attenuation. Typically the LO leakage is measured by turning off the wanted signal and measuring the LO leakage at an output of the mixer using some sort of power detector.

Certain applications have very tight requirements on the LO leakage. This may e.g. be phased array transmitters due to a combination of a large number of transmit signals into a single signal. The LO leakage requirement on each individual transmitter then becomes much harder to satisfy than for a single transmitter chain. Also, a change in e.g. ambient temperature typically affects the LO leakage which may be hard to account for by using e.g.
a traditional table based approach for compensation.

SUMMARY

Therefore, it is an object of embodiments herein to provide a technique for LO leakage detecting and cancellation.

According to one aspect of embodiments herein, the object is achieved by a mixer circuitry. The mixer circuitry comprises a first mixer configured to mix a first local oscillator, LO, signal having an LO frequency with an intermediate frequency, IF, signal and generate an output signal.

The mixer circuitry further comprises an LO leakage detector. The LO leakage detector comprises a coupler coupled to the output of the first mixer, a second mixer configured to mix a second oscillator signal with the output signal of the first mixer received from the coupler and generate an output signal. The second oscillator signal frequency is lower than the IF signal frequency.

The LO leakage detector further comprises a third quadrature mixer configured to mix the output signal of the second mixer with an LO signal having a same frequency as the first LO signal, and generate quadrature output signals having a same frequency as the second oscillator signal frequency.

The LO leakage detector further comprises an amplifier arrangement coupled to the third quadrature mixer for amplifying and filtering the quadrature output signals from the third quadrature mixer and a fourth mixer arrangement configured to mix the output signal from the amplifier arrangement with the second oscillator signal and generate a direct current, DC, signal.

The LO leakage detector further comprises an analog-to-digital converter arrangement for converting the DC signal from the fourth mixer arrangement to digital words representing detected LO leakage from the first mixer.

The mixer circuitry further comprises a digital processing unit configured to process the detected LO leakage and generate a control word and a digital-to-analog converter, DAC, arrangement coupled to IF input of the first mixer. The DAC arrangement is configured to receive the control word and adjust the IF input signal of the first mixer.

In other words, the mixer circuitry according to embodiments herein comprises a mixer, an LO leakage detector, a digital processing unit functioning as a digital LO leakage cancellation controller and a DAC arrangement. The LO leakage detector that measures the LO leakage at the output of the mixer in the presence of the wanted signal. Then in the LO leakage cancellation controller, a digital algorithm is run that automatically adjusts or cancels the LO leakage in the mixer. This is done by steering the digital-to-analog converter arrangement such that the intermediate frequency input signal level to the mixer is adjusted.

The mixer, the LO leakage detector and the LO leakage cancellation controller in the mixer circuitry may all be integrated into a single integrated circuit. Therefore, the integration of the cancellation controller, leakage detection and digital LO leakage minimization algorithm has the advantage of enabling a fully autonomous leakage cancellation scheme that can adapt to changing environmental conditions, this may typically be temperature but may also be aging, and/or supply voltage variation etc. In this way, a robust solution enabling very low LO leakage levels is obtained.

The embodiments herein has a potential of tracking temperature changes and other changes in the ambient conditions that may increase the LO leakage. By automatically adjusting the LO leakage cancellation controller to the observed LO leakage level it is possible to have very low LO leakage levels under a variety of conditions. This enables the mixer circuitry to comply with very severe leakage requirement levels. Furthermore, the embodiments herein presented detect and cancel the LO leakage in the presence of the wanted signal.

Thus, embodiments herein provide an improved technique for LO leakage detecting and cancellation.

BRIEF DESCRIPTION OF THE DRAWINGS

Examples of embodiments herein are described in more detail with reference to attached drawings in which.

DETAILED DESCRIPTION

Figure 1:
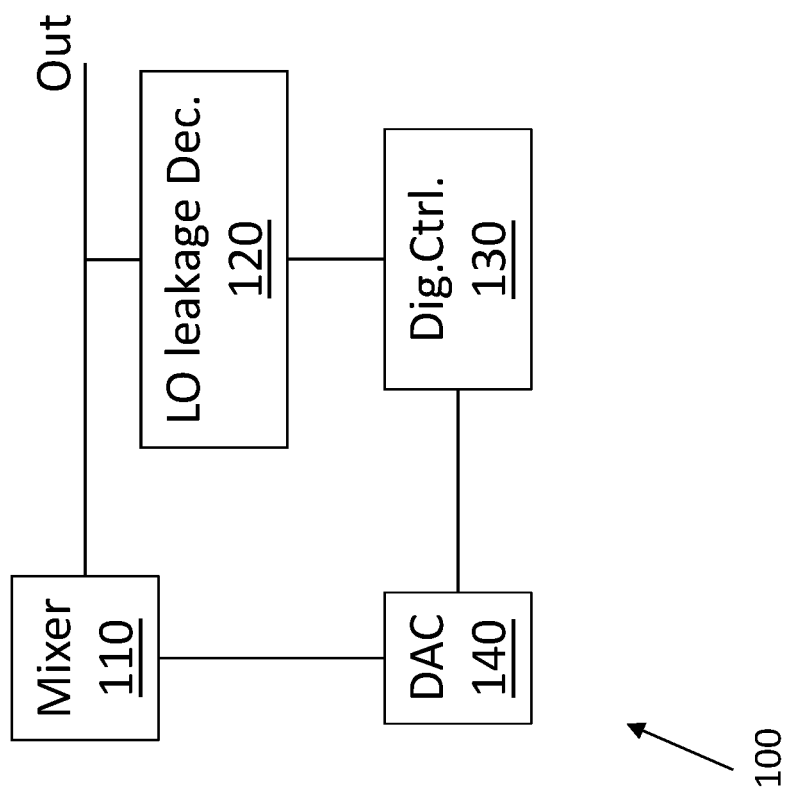
FIG. 1 is a general block view of a mixer circuitry according to embodiments herein.

FIG. 1 shows a general block of a mixer circuitry 100 according to embodiments herein. The mixer circuitry 100 comprises a mixer 110, an LO leakage detector 120, a digital processing unit 130, Dig. Ctrl., functioning as LO leakage cancellation controller, and a DAC arrangement 140. The mixer 110 is configured to mix a first local oscillator, LO, signal having an LO frequency $f_{LO}$ with an intermediate frequency, IF, signal and generate an output signal, i.e. a wanted signal. The LO leakage detector 120 measures the LO leakage at the output of the mixer 110 in the presence of the wanted signal. Then in the digital LO leakage cancellation controller 130, a digital algorithm is run that automatically adjusts the LO leakage in the mixer by steering the digital-to-analog converter arrangement 140 such that the intermediate frequency input signal level to the mixer 110 is adjusted.

Figure 2:
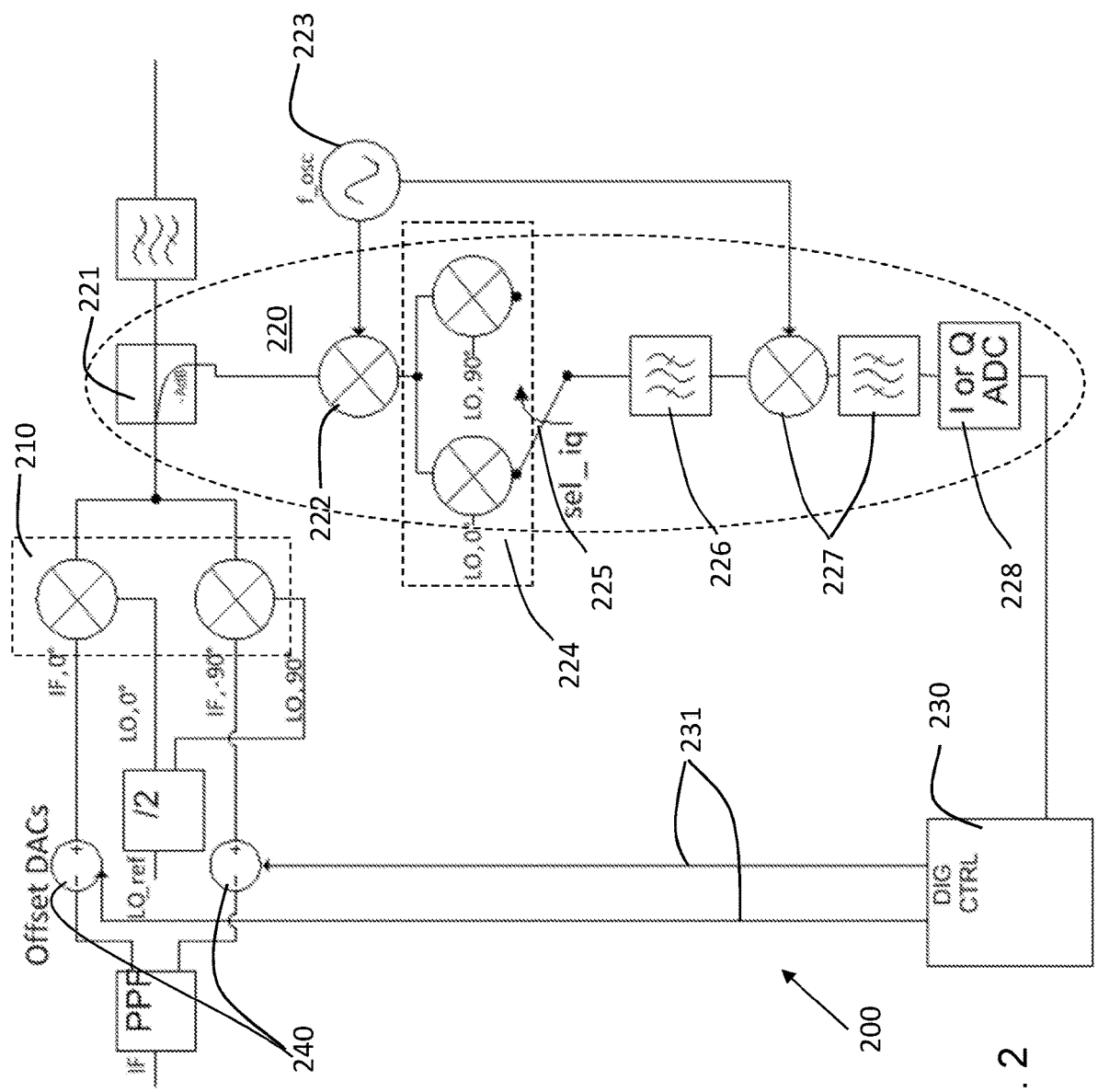
FIG. 2 is a block view of the mixer circuitry in FIG. 1 according to embodiments herein.

FIG. 2 shows in more detail the mixer circuitry 100, now denoted by a mixer circuitry 200. The mixer circuitry 200 comprises a first mixer 210 configured to mix a first local oscillator (LO) signal having an LO frequency, $f_{LO}$ or $\omega_{LO}=2*\pi*f_{LO}$, with an intermediate frequency (IF) signal, $f_{if}$ or $\omega_{if}=2*\pi*f_{if}$, and generate an output signal.

An output signal from a circuit may be denoted as $S*\exp(j*t*\omega+j*\alpha)$. S is the amplitude, $\omega$ is the angular frequency, $\omega=2*\pi*f$, where f is the frequency of the output signal, $\alpha$ is some arbitrary phase offset.

The output signal from the first mixer 210 may be denoted as $$S*\exp^{jt\omega_{if2}}+L*\exp^{jt\omega_{LO}+j\alpha}$$

Here S is the amplitude of the wanted signal and L is the amplitude of the unwanted LO leakage signal, $\omega_{if2}=\omega_{LO}-\omega_{if}$ in case of lower sideband mixer, or $\omega_{if2}=\omega_{LO}+\omega_{if}$ in case of upper sideband mixer.

The mixer circuitry 200 further comprises an LO leakage detector 220. The LO leakage detector 220 comprises a coupler 221 coupled to the output of the first mixer. The coupler may be a capacitor.

The coupler 221 attenuates the output signal from the first mixer 210 and the leakage signal by approximately the same amount A. And the resulting output from the coupler 221 is:

$$S/A*\exp^{jt\omega_{if2}}+L/A*\exp^{jt\omega_{LO}+j\alpha}$$

The LO leakage detector 220 further comprises a second mixer 222 configured to mix a second oscillator signal 223 with the output signal of the first mixer 210 received from the coupler 221 and generate an output signal. The second oscillator signal frequency is lower than the IF signal frequency. The second oscillator signal 223 is:

$$M*\exp^{j\omega_{OSC}}$$

The output signal from the second mixer 222 is:

$$\frac{S}{A}*G_c*\exp^{jt(\omega_{if2}\pm\omega_{OSC})}+\frac{L}{A}*G_c*\exp^{jt(\omega_{LO}\pm\omega_{OSC})+j\alpha}$$

Here $G_c$ is the conversion gain of the second mixer 222, which for simplicity is assumed to be identical for the two frequencies, $\omega_{if2}\pm\omega_{OSC}$ and $\omega_{LO}\pm\omega_{OSC}$.

The LO leakage detector 220 further comprises a third quadrature mixer 224 configured to mix the output signal of the second mixer 222 with an LO signal having a same frequency as the first LO signal $\omega_{LO}$, and generate quadrature output signals having a same frequency as the second oscillator signal frequency, $\omega_{OSC}$. The third quadrature mixer 224 may comprise a low-pass filter, e.g. a first order resistor-capacitor RC-filter. (not shown).

The I-component of the complex signal at the third quadrature mixer 224 output is:

$$\frac{S*G_c}{A*Att}*\exp^{jt(\omega_{if2}\pm\omega_{OSC}+\omega_{LO})}+$$

$$\frac{L*G_c*G_d}{A}*\exp^{jt(\omega_{LO}\pm\omega_{OSC}-\omega_{LO})+j\alpha}+\frac{L*G_c}{A*Att}*\exp^{jt(\omega_{LO}\pm\omega_{OSC}+\omega_{LO})+j\alpha}$$

The Q-component signal at mixer output is:

$$\frac{S*G_c}{A*Att}*\exp^{jt(\omega_{if2}\pm\omega_{OSC})\pm j(t\omega_{LO}+\pi/2)}+$$

$$\frac{L*G_c*G_d}{A}*\exp^{jt(\omega_{LO}\pm\omega_{OSC})+j\alpha-j(t\omega_{LO}+\pi/2)}+$$

$$\frac{S*G_c}{A*Att}*\exp^{jt(\omega_{LO}\pm\omega_{OSC})+j\alpha+j(t\omega_{LO}+\pi/2)}$$

Here Att is the frequency dependent attenuation of the low-pass filter in the third quadrature mixer 224. For simplicity, the same notation is used for all frequencies. All the frequencies will be high e.g. $\omega_{if}>>\omega_{OSC}$ except for the terms where $\omega_{LO}$ cancels out. Hence after dropping these high-frequency terms one obtains on the I-component mixer output:

$$\frac{L*G_c*G_d}{A}*\exp^{jt(\pm\omega_{OSC})+j\alpha}$$

and on the Q-component mixer output:

$$\frac{L*G_c*G_d}{A}*\exp^{jt(\pm\omega_{OSC})+j\alpha-j\pi/2}$$

Here $G_d$ is the conversion gain of the third quadrature mixer 224 for the angular frequency $\omega_{OSC}$. In reality there will still be some remnant of the IF angular frequency in the output but let's ignore this for simplicity.

The LO leakage detector 220 further comprises an amplifier arrangement 226 coupled to the third quadrature mixer 224 for amplifying and filtering the quadrature output signals from the third quadrature mixer 224. The amplifier arrangement 226 amplifies and filters the I-component or Q-component mixer output signal with a gain G.

The LO leakage detector 220 further comprises a fourth mixer arrangement 227 configured to mix the output signal from the amplifier arrangement 226 with the second oscillator signal and generate a direct current (DC) signal.

The DC output from I-component mixer:
From Q-component mixer:

$$I = \frac{L*G_c*G_d}{A} * \cos\alpha$$

$$Q = \frac{L*G_c*G_d}{A} * \cos\left(\alpha - \frac{\pi}{2}\right) = \frac{L*G_c*G_d}{A} * \sin\alpha$$

The LO leakage detector 220 further comprises an analog-to-digital converter arrangement 228 for converting the DC signal from the fourth mixer arrangement 227 to digital words representing a detected LO leakage from the first mixer 210.

The mixer circuitry 200 further comprises a digital processing unit 230, DIG CTRL, functioning as a digital LO leakage cancellation controller and being configured to process the detected LO leakage and generate a control word 231.

The mixer circuitry 200 further comprises a digital-to-analog converter (DAC) arrangement 240 coupled to IF input of the first mixer 210. The DAC arrangement 240 is configured to receive the control word 231 and adjust the IF input signal of the first mixer 210.

Note that due to unknown phase shift in a transmitter chain there is no a priori relationship between the I- and Q-signal components from the first mixer 210 and the I- and Q-signal components from the third mixer 240. The time constants involved in changing environmental conditions are typically much larger than the time constants in the mixer. Hence the I- and Q-signal components output from the third mixer 240 may be detected in a time multiplexed manner enabling less area usage and power usage for the detector.

Therefore according to some embodiments herein, the LO leakage detector 220 may further comprises a selector 225 coupled to the outputs of the third quadrature mixer 224 for selecting one of the quadrature output signals from the third quadrature mixer 224 at a time. The selector 225 either picks the I- or the Q-signal component which differ by a phase $\pi/2$.

In this case the amplifier arrangement 226 may comprise one single amplifier coupled to the output of the third quadrature mixer 224 via the selector 225 for amplifying and filtering one of the quadrature output signals at a time.

The fourth mixer arrangement 227 may comprise one single mixer, and the analog-to-digital converter arrangement 228 may comprise one single analog-to-digital converter.

According to some embodiments herein, the amplifier arrangement 226 may comprise two amplifiers for amplifying and filtering the quadrature output signals, I and Q, from the third quadrature mixer 224 in parallel.

In this case, the fourth mixer arrangement 227 may comprise two mixers, and the analog-to-digital converter arrangement 228 may comprise two analog-to-digital converters.

According to some embodiments herein, the first mixer 210 may be a quadrature mixer, and the DAC arrangement 240 may comprise two DACs configured to receive the control word 231 and adjust the quadrature IF input signals of the first mixer 210.

According to some embodiments herein, the digital processing unit 230 may be configured to accumulate the detected LO leakage over a number of samples to generate the control word 231 to adjust settings of the DAC arrangement 240 such that the averaged LO leakage are minimized.

For example, in a digital algorithm implemented in the digital processing unit 230, the quantity $$I^2 + Q^2 = \left(\frac{L*G_c*G_d}{A}\right)^2$$

is formed which then is independent of the arbitrary phase $\alpha$. The digital algorithm accumulates the detected I-phase and Q-phase leakage over a suitable number of samples to form the detected leakage level in an arbitrary scale. The purpose of the algorithm is then to find the optimum DAC settings which minimize $I^2+Q^2$. This may be done by starting at e.g. default settings and then use e.g. a steepest descent algorithm to find the optimum settings.

A sketch of this procedure may be: from any DAC word setting, e.g. IDAC and QDAC for the I- and Q-signal components, one may test 9 different settings, such as IDAC+step*$s1$,QDAC+step*$s2$ where s1,s2 take values [−1,0,1] and step is some positive integer 1,2,3, . . . .

For fine-tuning, the step size should be 1 but it might be advantageous to use larger step sizes if changes are small. Out of the 9 different cases, the one which gives the smallest resulting $I^2+Q^2$ is picked.

Therefore according to some embodiments herein, the digital processing unit 230 may be configured to accumulate the detected I-phase and Q-phase LO leakage over a number of samples to generate the control word 231 to adjust settings of the two DACs 240 such that the averaged I-phase and Q-phase LO leakage, $I^2+Q^2$, is minimized.

Note however that there will be offsets in the LO leakage detector 220 which distorts the result. To overcome this issue, the offset is measured by turning off the first mixer 210 and measuring the detected leakage level. This offset is then subtracted from the observed leakage level when the first mixer 210 is enabled to give the true observed leakage level.

Figure 3:
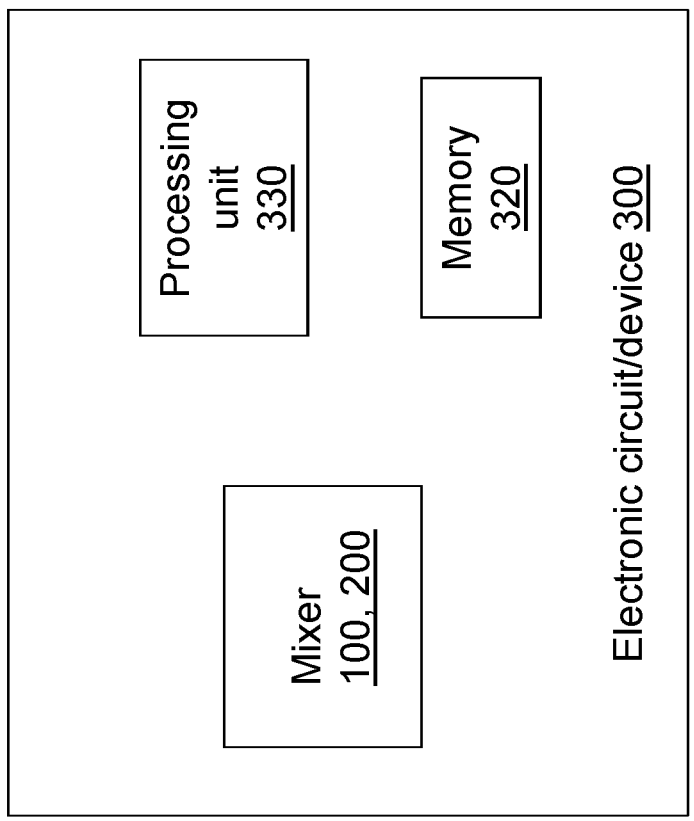
FIG. 3 is a block diagram illustrating an electronic circuit or device in which embodiments herein may be implemented.

The mixer circuitry 100, 200 according to embodiments herein may be implemented in any electronic circuit or device. FIG. 3 shows an electronic circuit or device 300 in which the mixer circuitry 100, 200 according to embodiments herein may be implemented. The electronic circuit or device 1100 may be any one of an electronic circuit, such as a transceiver, a transmitter, a receiver, a frequency synthesiser etc. The electronic circuit or device 300 may also be any one of a communication device, such as a base station or beamforming base station, a mobile terminal or a user equipment for a cellular communications system or in a wireless communication system, then the electronic circuit or device 300 may comprise other units, e.g. a memory 320 and a processing unit 330 for information storage and signal processing etc.

One of advantages of the mixer circuitry 100, 200 according to embodiments herein is that the mixer, the LO leakage detector and the digital LO leakage cancellation controller as well as the minimization algorithm in the mixer circuitry may all be integrated into a single integrated circuit. This enables a fully autonomous leakage cancellation scheme adapted to changing environmental conditions, typically temperature but may also be e.g. aging, supply voltage variation etc. In this way, a robust solution enabling very low LO leakage levels is obtained.

The embodiments herein has a potential of tracking temperature changes and other changes in the ambient conditions that may increase the LO leakage. By automatically adjusting the LO leakage cancellation controller to the observed LO leakage level it is possible to have very low LO leakage levels under a variety of conditions. This enables a product in which the embodiments herein implemented being used even under very severe leakage requirement levels. Furthermore, the embodiments herein detect and cancel the LO leakage in the presence of the wanted signal.

The word "comprise" or "comprising" shall in this text be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A mixer circuitry comprises:
   a first mixer configured to mix a first local oscillator, LO, signal having an LO frequency with an intermediate frequency, IF, signal and generate an output signal; and
   an LO leakage detector comprising:
      a coupler coupled to the output of the first mixer;
      a second mixer configured to mix a second oscillator signal with the output signal of the first mixer received from the coupler and generate an output signal, wherein the second oscillator signal frequency is lower than the IF signal frequency;
      a third quadrature mixer configured to mix the output signal of the second mixer with an LO signal having a same frequency as the first LO signal, and generate quadrature output signals having a same frequency as the second oscillator signal frequency;
      an amplifier arrangement coupled to the third quadrature mixer for amplifying and filtering the quadrature output signals from the third quadrature mixer;
      a fourth mixer arrangement configured to mix the output signal from the amplifier arrangement with the second oscillator signal and generate a direct current, DC, signal; and
      an analog-to-digital converter arrangement for converting the DC signal from the fourth mixer arrangement to digital words representing detected LO leakage from the first mixer;
   the mixer circuitry further comprises:
      a digital processing unit configured to process the detected LO leakage and generate a control word; and
      a digital-to-analog converter, DAC, arrangement coupled to IF input of the first mixer, wherein the DAC arrangement is configured to receive the control word and adjust the IF input signal of the first mixer.

2. The mixer circuitry according to claim 1, wherein the amplifier arrangement comprises two amplifiers for amplifying and filtering the quadrature output signals from the third quadrature mixer in parallel.

3. The mixer circuitry according to claim 2, wherein the fourth mixer arrangement comprises two mixers, and the analog-to-digital converter arrangement comprises two analog-to-digital converters.

4. The mixer circuitry according to claim 1 further comprising a selector coupled to the outputs of the third quadrature mixer for selecting one of the quadrature output signals from the third quadrature mixer at a time, and the amplifier arrangement comprises one single amplifier coupled to the output of the third quadrature mixer via the selector for amplifying and filtering one of the quadrature output signals at a time.

5. The mixer circuitry according to claim 4, wherein the fourth mixer arrangement comprises one single mixer, and the analog-to-digital converter arrangement comprises one single analog-to-digital converter.

6. The mixer circuitry according to claim 1, wherein the digital processing unit is configured to accumulate the detected LO leakage over a number of samples to generate the control word to adjust settings of the DAC arrangement such that the averaged LO leakage are minimized.

7. The mixer circuitry according to claim 1, wherein the first mixer is a quadrature mixer, and the DAC arrangement comprises two DACs configured to receive the control word and adjust the quadrature IF input signals of the first mixer.

8. The mixer circuitry according to claim 7, wherein the digital processing unit is configured to accumulate the detected I-phase and Q-phase LO leakage over a number of samples to generate the control word to adjust settings of the two DACs such that the averaged I-phase and Q-phase LO leakage, $I^2+Q^2$, is minimized.

9. The mixer circuitry according to claim 1, wherein the coupler is a capacitor.

10. An electronic circuit comprising mixer circuitry, the mixer circuitry comprising:
    a first mixer configured to mix a first local oscillator, LO, signal having an LO frequency with an intermediate frequency, IF, signal and generate an output signal; and
    an LO leakage detector comprising:
       a coupler coupled to the output of the first mixer;
       a second mixer configured to mix a second oscillator signal with the output signal of the first mixer received from the coupler and generate an output signal, wherein the second oscillator signal frequency is lower than the IF signal frequency;
       a third quadrature mixer configured to mix the output signal of the second mixer with an LO signal having a same frequency as the first LO signal, and generate quadrature output signals having a same frequency as the second oscillator signal frequency;
       an amplifier arrangement coupled to the third quadrature mixer for amplifying and filtering the quadrature output signals from the third quadrature mixer;
       a fourth mixer arrangement configured to mix the output signal from the amplifier arrangement with the second oscillator signal and generate a direct current, DC, signal; and
       an analog-to-digital converter arrangement for converting the DC signal from the fourth mixer arrangement to digital words representing detected LO leakage from the first mixer;
    the mixer circuitry further comprises:
       a digital processing unit configured to process the detected LO leakage and generate a control word; and
       a digital-to-analog converter, DAC, arrangement coupled to IF input of the first mixer, wherein the DAC arrangement is configured to receive the control word and adjust the IF input signal of the first mixer.

11. The electronic circuit according to claim 10 comprising any one of a frequency synthesiser, a transceiver, a transmitter, a receiver.

12. The electronic circuit according to claim 10 comprising any one of a base station, beamforming base station, a mobile terminal or a user equipment for a cellular communications system or in a wireless communication system.

* * * * *